United States Patent [19]

Hosokawa

[11] Patent Number: 5,279,671
[45] Date of Patent: Jan. 18, 1994

[54] THERMAL VAPOR DEPOSITION APPARATUS

[76] Inventor: Iwao Hosokawa, Univ. of Electro-Communications, Dept. of Mechanical and Control Engineering, Chofu, Tokyo 182, Japan

[21] Appl. No.: 897,990

[22] Filed: Jun. 16, 1992

[51] Int. Cl.⁵ .................. C23C 14/00; C23C 16/00
[52] U.S. Cl. ................................ 118/725; 118/724
[58] Field of Search ............................ 118/724, 725

[56] References Cited

U.S. PATENT DOCUMENTS

| | | | |
|---|---|---|---|
| 3,790,620 | 7/1973 | Eversteijn et al. | 118/725 |
| 4,535,227 | 8/1985 | Shimizu | 118/725 |
| 4,535,228 | 8/1985 | Mimura et al. | 118/725 |
| 4,651,673 | 3/1987 | Muething | 118/725 |
| 5,133,286 | 7/1992 | Choo et al. | 118/725 |

FOREIGN PATENT DOCUMENTS 3-038029  2/1991  Japan .................... 118/725

*Primary Examiner*—Asok Pal
*Attorney, Agent, or Firm*—Griffin, Butler, Whisenhunt & Kurtossy

[57] ABSTRACT

An improvement in a thermal vapor disposition apparatus having an enclosure with a gas inlet, a gas outlet, side walls, a susceptor, gas flow means for causing a flow of gas from the inlet to the outlet and heating means for heating the susceptor, where a temperature gradient is imposed on the susceptor and/or a temperature control means controls the temperature profile of the side walls.

13 Claims, 4 Drawing Sheets

THERMAL VAPOR DEPOSITION APPARATUS

The present invention relates to a thermal vapor deposition apparatus, and particularly to such apparatus which causes the growth of a film deposited from vapor onto a substrate, such as a wafer, and more particularly to such apparatus where the uniformity of the deposited film is substantially increased.

BACKGROUND OF THE INVENTION

The present invention is concerned With a vapor deposition apparatus. As known in the art, such apparatus is used for depositing a film from vapor onto a substrate. For example, the substrate may be a wafer, such as a silicon wafer, and a film of deposited vapor on that substrate is used in the manufacture of semiconductors and other like devices. Alternatively, such an apparatus can be used for causing the uniform evaporation of a film from a substrate, such as a wafer, and this can be used in an etching process by choosing the chemical reaction between the reactants and the film.

In such an apparatus, it is necessary to have an enclosure such that the vapor flows through the enclosure and contacts a very hot susceptor disposed therein so that the desired deposition or evaporation may take place. The temperature of the susceptor is set for particular vapors and wafers and can vary according to those parameters, which are well known in the art. While the specific arrangement of such an enclosure can vary considerably, these enclosures, as major components, include a first end wall with a vapor inlet therein, a second end wall with a vapor outlet therein, side walls, a top wall, a bottom wall, a susceptor having a top surface, gas flow control means for causing a flow of the vapor from the inlet to the outlet, and heating means for heating the susceptor to high temperatures required for specific vapors/wafers. The present apparatus has those same major components.

There are two main types of vapor deposition apparatus. The first is the so-called "horizontal" type, and the second is the so-called "vertical" type. In the horizontal type apparatus, the susceptor is disposed horizontally within the enclosure and the vapor flows parallel to the susceptor. In the vertical type, the susceptor is also disposed horizontally, but the vapor flows transverse thereto, e.g. from a top portion with an inlet, along the side walls, to and along the susceptor, and out an outlet on a bottom portion.

In both of these types of apparatus, the vapor flow through the enclosure may be entirely the chemical compound which is intended to be deposited, or it may be a combination of the vapor of that compound and a carrier gas. Generically, whether the flow is entirely of the chemical compound or mixed with a carrier gas, the flow is referred to as the "gas flow", and that term will be used hereinafter.

However, these conventional devices have a substantial disadvantage in that the very hot susceptor, placed on the bottom wall, of, for example, a "horizontal" type apparatus, necessarily causes thermal convection flows of the gas within the enclosures. These convection flows, coupled with the main gas flow through in the enclosure, causes stable gas rolls in the flow of the gas, such that the temperature near the susceptor or, for example, a wafer thereon, is never horizontally uniform, even though the temperature of the susceptor itself is uniform. This vertical temperature non-uniformity may be referred to as a vertical temperature gradient, i.e. a gradient extending vertically from the susceptor or wafer thereon. Since the mass flux of the vapor onto the wafer is strongly dependent on the temperature gradient vertical to the susceptor or wafer, the growth of a deposited film, therefore, becomes non-uniform.

In order to achieve a more uniform growth of the film, the prior art has considered it necessary to exercise some control of the gas flow, and various prior art approaches have been suggested for this purpose. One suggested method is that of rotating the susceptor so as to smooth out the local temperatures near the susceptor or wafer, i.e the vertical temperature gradient, and, hence, smooth out deposition rates across the susceptor, but this approach considerably complicates the apparatus. Another suggested method is that of reducing the pressure inside the enclosure, but this even further complicates the apparatus and involves vacuum pumping systems.

A recent and important suggestion is that of suppressing the stable gas rolls by controlling the temperature of the side walls of the enclosure (see laid open Japanese Application No. 137620/1989). This approach uses special heaters along the side walls. As a result, the gas flow becomes unsteady, and hence no stable gas rolls are possible. When the so-called "horizontal" apparatus is so controlled, a time-average horizontal uniformity of the vertical temperature gradient of gas at the susceptor is achieved, however, only when the vapor flow is within certain Reynolds numbers (Re) and Grashof numbers (Gr). Further, this approach can achieve uniform growth of the film only in the direction of the susceptor which is transverse to the direction of the gas flow and cannot achieve uniform film growth in the direction of the gas flow. This is because the concentrations of the vapor to be deposited from the gas flow decrease as the gas flow proceeds through the enclosure, since the deposited vapor depletes the vapor content in the gas flow.

In order to improve this situation, it has been suggested to reduce the cross-sectional area of the enclosure near a downstream portion thereof so as to increase the flow speed of the gas. With this, the concentration of the vapor per unit volume can be increased. However, the optimum geometrical shape of such an enclosure, for this purpose, is not simple, and the apparatus becomes very complicated.

SUMMARY OF THE INVENTION

The present invention is based on the discovery that by arranging the temperature distribution in the whole enclosure and at the susceptor, and consequently on a wafer or the like disposed thereon, the uniformity of mass transfer at the susceptor can be very substantially improved. In one aspect thereof, the temperature profile of the side walls can be so controlled that the prior art stable gas rolls in the enclosure can be avoided and, thus, a more uniform film deposition is achieved. In another aspect, a temperature gradient is imposed on the susceptor to cause the deposited film to grow more uniformly over the entire surface of the susceptor, or a wafer thereon.

More particularly, according to one aspect of the present invention, a temperature gradient is imposed on the susceptor (especially at least the top surface thereof) so as to provide a more uniform deposition of the vapor thereon. This temperature gradient can compensate for the depletion of the vapor in the gas flow when the temperature gradient is at least in the direction of the gas flow such that the temperature of the susceptor, or at least the top surface thereof, or wafer thereon, is higher near the outlet than near the inlet of the enclosure. In another aspect, the temperature gradient may be imposed in the direction transverse to the gas flow to compensate for the vapor concentration due to stable convection gas rolls, when they cannot be avoided. These aspects are based on the principle that the chemical reaction of deposition, for a given concentration of vapor, is accelerated where the temperature is higher.

While a wide variety of means may be used to achieve such gradients, as an illustrative example, the temperature gradient may be created by adjusting the electric power supplied to separate heaters disposed near the susceptor.

In another aspect of the invention, and particularly in regard to the "horizontal" type apparatus, the gas flow should be in an unsteady state (referred to in the art as quasi-periodic and chaotic), and this can be controlled by a non-linear temperature profile along portions of the side walls, particularly when the gas flow is within certain Reynolds numbers and Grashof numbers. As an illustrative example thereof, the temperature profile of the side walls is normally almost linear by reason of heat conduction of heat generated from the bottom wall of the enclosure. However, it was found that the temperature profile of the side walls can be adjusted by changing the thermal conductivity of at least a part of the side walls, and this change can, at least largely, avoid the stable gas rolls of the prior art.

While this change of thermal conductivity and temperature profile can be achieved by a variety of means, as an illustrative example, that changed temperature profile may be achieved by using spacers disposed in the side walls, which spacers have a thermal conductivity less than that of the side walls themselves.

Accordingly, and briefly stated, in the broader aspect of the present invention, there is provided an improvement in a thermal vapor deposition apparatus. That apparatus comprises an enclosure having at least a gas inlet, a gas outlet, side walls, a susceptor, gas flow means for causing a flow of gas from the inlet to the outlet, and heating means for heating the susceptor. The present improvement comprises temperature gradient means for imposing a temperature gradient on the susceptor. In the other aspect, the further improvement is that of temperature control means for controlling the temperature profile of the side walls.

DETAIL DESCRIPTION OF THE INVENTION

Figure 1:
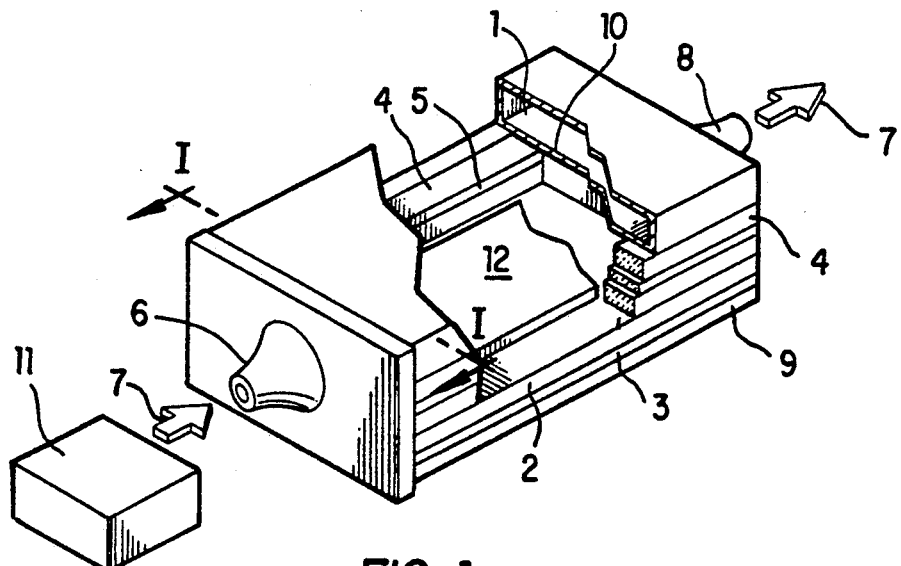
FIG. 1 is a perspective view, partially cut away, of an embodiment of the invention utilizing a "horizontal" type apparatus.

FIG. 1 shows a perspective, partially cut away, view of a typical "horizontal" type apparatus embodying the present invention. That apparatus has a cooling surface 1, a susceptor 2, a system of heaters 3, side walls 4, spacers 5 therein (only one spacer being shown), a gas inlet 6 for gas flow through the apparatus (shown by arrows 7), a gas outlet 8, a bottom wall 9 and a top wall 10. The numeral 11 diagrammatically illustrates a gas flow means for causing a flow of gas from the inlet to the outlet, and this gas flow means can be any of the conventional means, such as a pressurized source of the gas, a pump, or the like.

Figure 2:
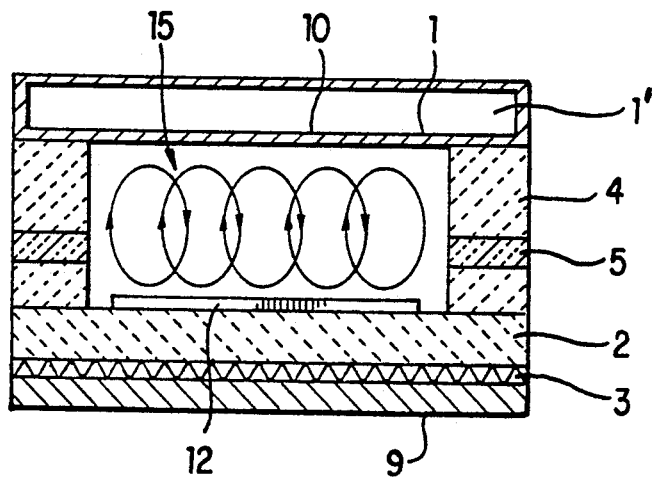
FIG. 2 is a cross-section of FIG. 1, taken along lines I—I, and also showing the flow path of gas in the enclosure caused by convection rolls within the enclosure.

As can be better seen in FIG. 2, a wafer 12 is placed on susceptor 2 for the usual purposes in a vapor deposition apparatus. Heaters 3, of course, causes heat conduction through susceptor 2 and into wafer 12, which, in turn, causes convection currents, generally indicated by arrow 15, in the enclosure, as briefly explained above. To more specifically illustrate this problem of the prior art, as briefly described above, and improvements provided by the present invention, an analysis of a specific example of such an enclosure is set forth below.

Assuming that the enclosure of a "horizontal" type thermal chemical vapor deposition (CVD) apparatus is constituted by a horizontal rectangular duct, heated from below by heaters 3, with an aspect ratio of 2, and that the gas flow parameters are Re=220 and Rayleigh number (Ra)=$3.4 \times 10^5$, which are close to the conditions of a typical thermal CVD apparatus, the following analysis demonstrates the relation between the gas flow pattern and the temperature profile of the side walls of that enclosure. The Re and Ra numbers are based on the equivalent hydraulic diameter of the duct. The temperature profile is given by fixing the temperatures of portions of the side walls, e.g. the temperature of an upper portion and a lower portion of each side wall. By measuring the time-averaged, temperature distribution of the gas above the susceptor, it can be determined if the temperature of the middle of the duct is higher than that at the sides thereof. If such is the case, then there is a steady upward gas flow in that middle portion of the duct, which indicates the existence of a pair of longitudinal Bénard gas rolls. If the temperature of the middle of the duct is lower than that of the sides of the duct, then there is a steady downward gas flow in the middle of the duct, which indicates the existence of similar gas rolls, but in the reverse direction. If the temperature is essentially uniform, then there are no steady gas rolls in the duct. These gas rolls are diagrammatically illustrated in FIG. 2, generally, by the arrow 15.

Figure 4A:
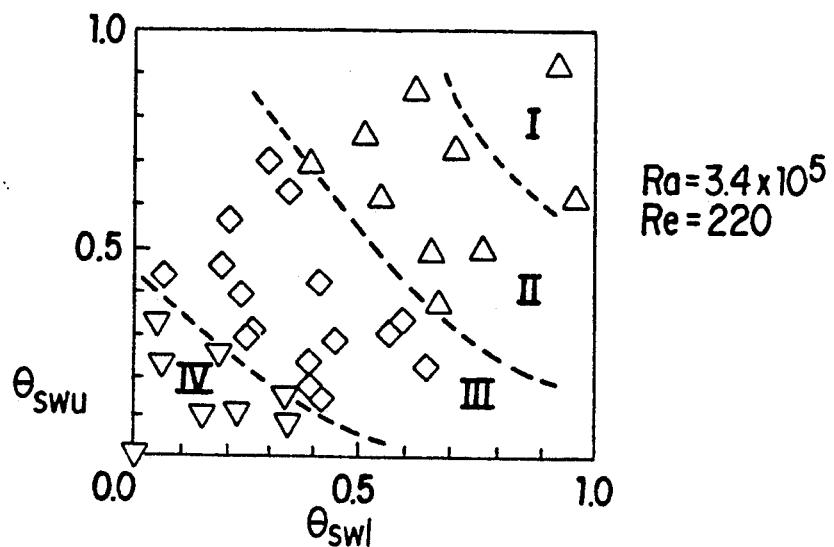
FIGS. 4a, 4b and 4c are graphical illustrations showing the states of the gas flow as those states vary with the temperature profile of the side walls.

The experimental results of such temperature measurements are shown in FIG. 4a, in which the units of the vertical axis are the dimensionless temperature Θ of the upper half of both side walls, $\Theta_{swu}$, and the horizontal axis is that of the lower half of both side walls, $\Theta_{swl}$. These dimensionless temperatures are defined by:

$$\Theta = (T - T_t)/(T_b - T_t)$$

where T is absolute temperatures and $_b$ and $_t$ indicate the temperatures of the bottom wall and the top wall, so that the non-dimensional temperature $\Theta$ may run from 0.0 to 1.0, as FIG. 4 shows. In region IV of FIG. 4a, there are a pair of longitudinal Bénard gas rolls, the gas flow of which goes down along each side wall. In regions I and II, there are a pair of the longitudinal gas rolls in the reverse direction to the former, so that the gas flow goes up along each side wall. The flow behavior in region I is in good accord with exact solutions of the steady Boussinesq set of equations for the present problem, but those in regions II, III and IV are not. In regions II and IV, the above-described gas rolls slightly oscillate and are not in an exactly steady state. In region III, stable pairs of longitudinal gas rolls cannot be observed, but the gas flow is in an unsteady state, e.g. quasi-periodic or chaotic flow. In this region, the time-averaged temperature distribution in the duct in the horizontal direction is uniform except very near the side walls. In order to realize such desirable flows as seen in region III in this case, $\Theta_{swu} + \Theta_{swl}$ should be between about 0.5 and 1.0, as is easily judged from FIG. 4a.

Figure 4B:
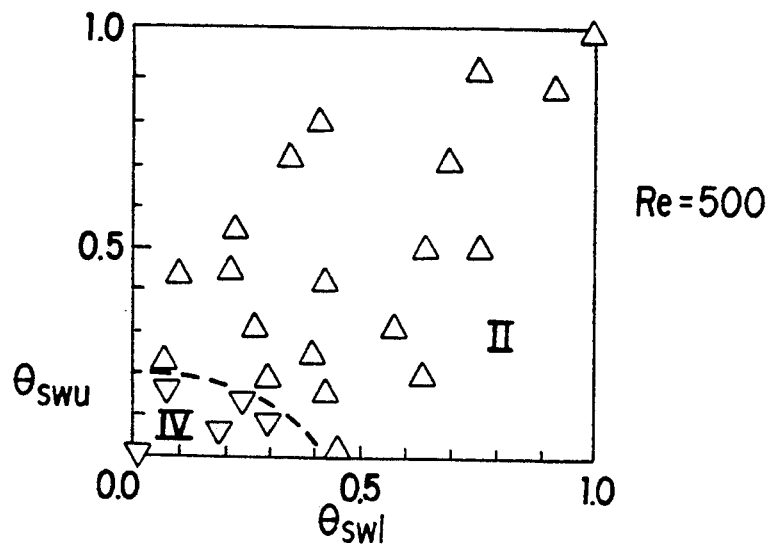
Figure 4C:
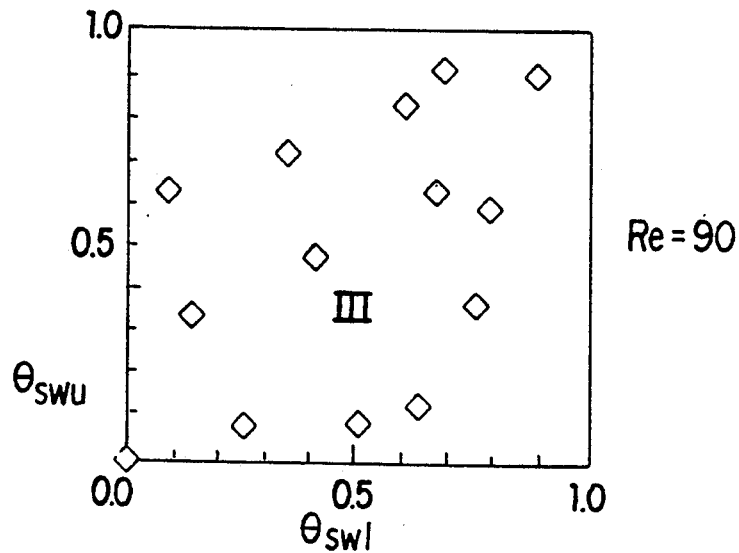

For reference, the cases of Re=500 and 90 are shown in FIGS. 4b and 4c, respectively. For Re=500, there are regions II and IV only, so that the stable longitudinal gas rolls cannot be destroyed by controlling side wall temperatures. For Re=90, no stable longitudinal gas rolls appear for any temperature profile of the side walls.

In order to verify that, under the above-described unsteady state gas flow conditions, a uniform mass flux is obtained at the susceptor (heated from below), observations were made in connection with the evaporation of a 50 mm wide, 80 mm long and 5 mm thick naphthalene plate embedded in the bottom wall of the duct. This is an indirect proof of the uniform growth of a film when the mass flux of evaporated matter is uniform.

Figure 5A:
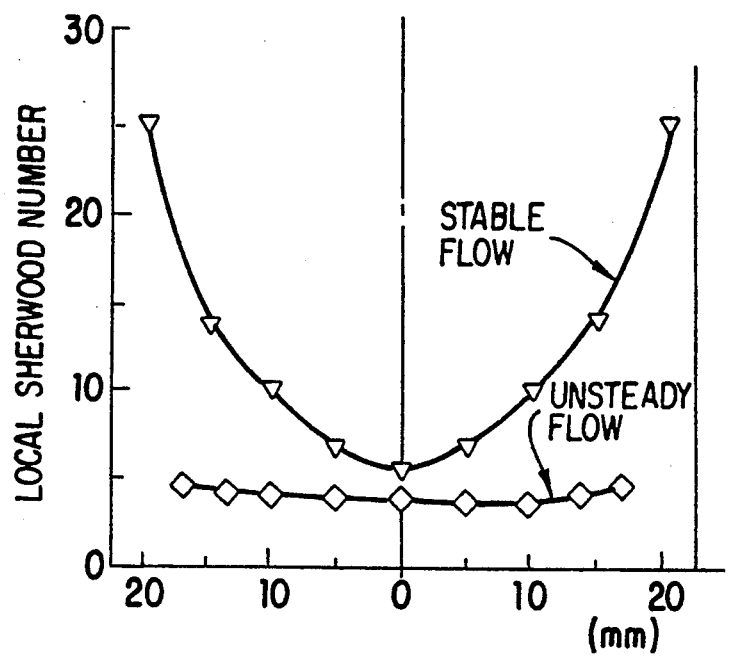
FIGS. 5a and 5b are graphical illustrations showing local Sherwood number distributions for typical states of the gas flow.
Figure 5B:
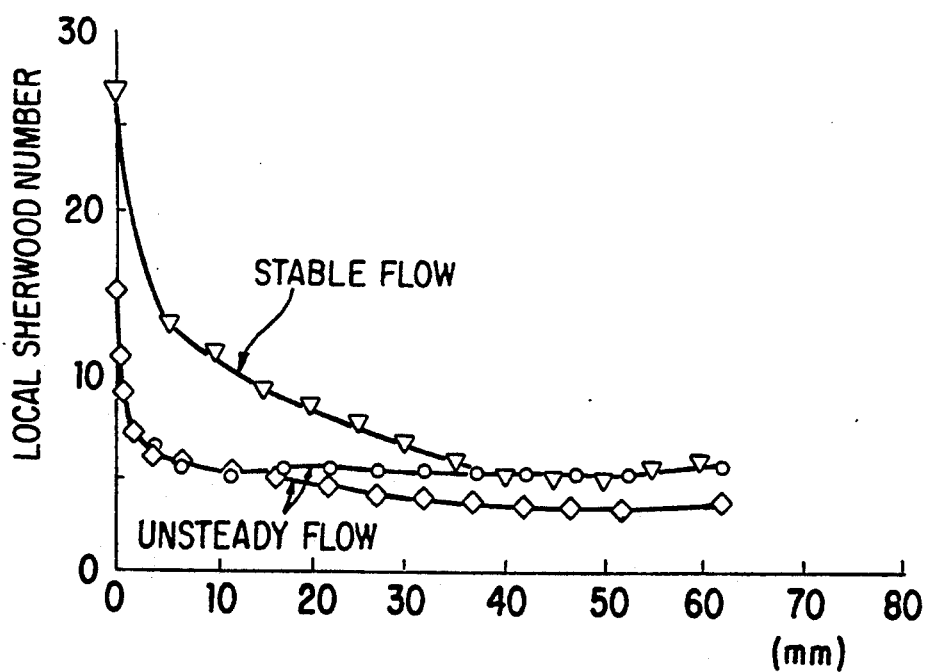

FIG. 5a shows the widthwise, and FIG. 5b shows the longitudinal, local Sherwood number distributions, which represent the local mass-transfer-rate distributions of naphthalene observed at the middle portions of the plate, the temperature of which was about 328 K. For the case of $\Theta_{swu} = \Theta_{swl} = 0$ (the side walls are just as cool as the top wall), in region IV, indicated by symbol $\nabla$, the widthwise distribution is minimum in the middle of the plate but increases rapidly towards the sides thereof, as a result of a pair of stable Bénard gas rolls, in which the gas flow goes up in the middle and down along the side walls. At the same time, the longitudinal distribution (in the gas flow direction) considerably decreases downstream.

However, for $\Theta_{swu} = 0.311$ and $\Theta_{swl} = 0.29$ (the temperatures of the side walls are non-linear), in region III, indicated by symbol $\diamond$, the widthwise distribution is almost uniform in consequence of a mixing effect by the unsteady state gas flow, as shown in FIG. 5a, but the longitudinal distribution slightly decreases in downstream direction, as shown in FIG. 5b.

These experimental results show that a relative uniform mass flux may be obtained at the susceptor, with high uniformity in the widthwise direction but with slightly less uniformity in the gas flow direction, by changing the stable Bénard gas rolls into an unsteady state gas flow (referred to in the art as quasi-periodic or chaotic gas flow) by means of a control of the temperature profile of the side walls of the duct.

In regard to a broader aspect of the invention, it will be noted from FIG. 5b that the mass flux, indicated by symbol $\diamond$, is slightly decreased in the gas flow direction. In order to make the mass flux slightly increased and more uniform in the gas flow direction, the bottom wall of the duct is provided with a longitudinal (in the gas flow direction) temperature gradient. This gradient, of course, will vary with the particular system, e.g. the duct, the temperatures thereof, the mass to be transferred, the size of the susceptor, etc., and some experimental data along the above lines will, usually, be required to set a correct gradient. Alternatively, the gradient can be established for a particular system by trial and error, e.g. setting a gradient and observing, for example, the uniformity of a deposited film. However, in most systems the gradient will generally be somewhere about 0.01° to 2.0° K./mm of the susceptor or wafer, but more usually between about 0.03° and 0.1° K./mm for typical mean susceptor temperatures between about 400° K. to 2000° K., especially about 900° K. to 1500° K. In any case, the temperature gradient is such that the mass flux at the susceptor (deposition or evaporization) is substantially uniform in the gas flow direction.

Such gradients can be easily achieved by a variety of means and the particular means is not critical. A very convenient means is that of a series of electric heaters, especially such electric heaters which are separated from each other, with each having an individual variable power supply. By adjusting the power supply to each heater in the gas flow direction, an appropriate temperature gradient in the gas flow direction (longitudinal gradient) is easily achieved. For example, in the particular system described above, an appropriate gradient of about 0.06 K/mm is easily achieved by changing the electric power supplied to heaters separately embedded into the bottom wall. With such, the resulting local sherwood number is indicated by symbol $\diamond$ in FIG. 5b, and it can be seen that very even distribution is achieved.

The necessary temperature gradient for any particular apparatus also depends on the temperature dependence of the reaction rate constants, diffusion coefficient and saturation pressures of the reactants. But, here again, these can be rather easily found by experiment.

While the above illustrates how the susceptor, or wafer thereon, may have a temperature gradient imposed thereon in the gas flow direction (longitudinal direction), as noted above, it is also necessary to compensate for the gas rolls in the widthwise direction (transverse direction) of the enclosure, in order to provide a fully uniform film or mass transfer. Such widthwise (transverse) compensation, in regard to stable gas rolls, may also be achieved by a similar temperature gradient imposed on the susceptor (or wafer) in a widthwise (transverse) direction. However, in such a transverse temperature gradient, the gradient should be much larger than the above-described longitudinal temperature gradient, e.g. from 2 to 20 times that of the longitudinal gradient, especially 5 to 15 times, and usually about 10 times. The magnitude of the transverse gradient must also increase in the direction from about the middle of the susceptor to the side walls.

As can be appreciated from the above, imposing both longitudinal and transverse temperature gradients on a single susceptor (or wafer) requires very careful and precise temperature control of the temperatures on the susceptor. While such precise control to provide both gradients can be achieved by spaced-apart heaters, as described above, such control becomes complex and is not desired for some applications of the invention. In this regard, widthwise gas rolls can usually be controlled in the present invention by a more simple and easier to operate technique, as briefly described above, and the more complex transverse temperature gradient is not normally required.

Thus, as briefly noted above, the widthwise uniformity can be achieved in a more simple fluid-dynamic manner by controlling the temperature profile of the side walls. A convenient method of achieving this result is illustrated in FIGS. 1 and 2, where a temperature control means, e.g. a spacer 5, is embedded in the side walls to provide a non-linear temperature profile therein. The thermal conductivity of the spacer is lower than the thermal conductivity of that of side walls. Accordingly, with the spacer 5 inserted into side walls 4, a non-linear temperature profile occurs, and the temperature profile of the side walls is changed from the profile without the spacer. This results in a non-linear temperature gradient along the side walls as a result of heat conduction from the bottom wall (and the heaters).

Figure 3:
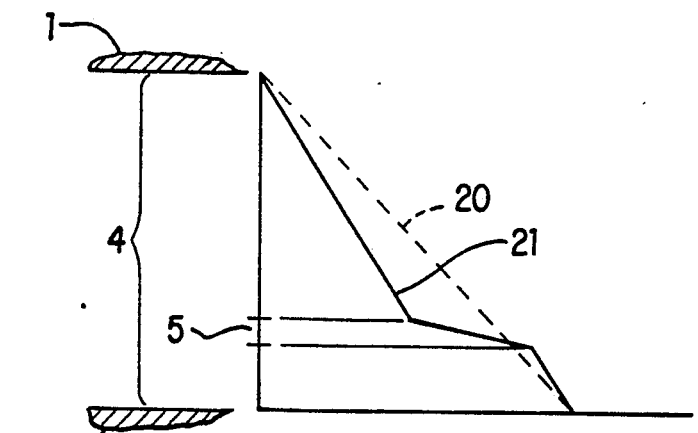
FIG. 3 is a diagrammatic illustration showing typical side wall temperature profiles with and without a spacer in the side walls.

The effect of this may be seen in FIG. 3. Thus, as shown in FIG. 3, the temperature distribution on the side wall is a straight line (linear) when no spacer is present, as illustrated by dotted line 20 in FIG. 3, e.g. when the side walls are made of a single material. However, the temperature distribution of the side walls can be changed to a non-linear distribution by use of spacer 5, and solid line 21 shows a typical temperature profile change by use of such spacer 5. Such a changed temperature distribution, for the reasons explained above, causes an unsteady state gas flow, e.g. a quasi-periodic or chaotic gas flow, which, for the reasons explained above, avoids the stable gas rolls of the prior art.

The exact non-linear temperature profile introduced by such a spacer will vary with the material, the thickness, and the position of spacer 5 in the side walls 4, as well as the relative thermal conductivity of the side walls 4 and the spacer 5. Here again, the particular spacer, and its position, must be determined for a particular system, but, here again, the particular material of the spacer and its position in the side walls can be easily obtained by routine experimentation. However, generally speaking, the thermal conductivity of the side walls should be at least about 1.5 times the thermal conductivity of the spacer, more usually at least 2 times, and more ideally about 4 to 5 times. Consequently, the temperature profile along the side walls separated by the spacer may vary considerably, e.g. so as to achieve region III in FIG. 4a.

Likewise, the vertical position of the spacer in the side walls should be determined for any particular system, but, generally speaking, the spacer will be disposed in the lower half of the side walls, and more preferably in the lower one quarter or eighth of the side walls, or even just above the susceptor and the bottom wall. As illustrated in FIG. 2, the spacer, more usually, will be positioned such that the lower portion of the spacer is near or at the juncture of the side walls and the bottom wall. In any case, the spacer must be of a material, size, thickness, heat conductivity and at a position in the side wall to so change the temperature profile of the side wall that a uniform mass flux at the susceptor (deposition or evaporization) is achieved, at least in a direction transverse to the gas flow.

It will also be appreciated from the foregoing that it is not the spacer, per se, which provides the results of the present invention, but the non-uniform heat conductivity and, hence, non-linear temperature profile of the side walls. Obviously, therefore, that non-linear profile can be achieved by means other than the use of spacers. Thus, the temperature control means may be, for example, notches placed in the outside portions of the side walls, or even the inside portions of the side walls, or holes drilled in the side walls, both of which will similarly control the thermal conductivity and, hence, the temperature profile of the side walls. Also, the side walls could be narrowed, i.e. have less thickness, at the required position to achieve similar changes in thermal conductivity and temperature profile. Alternately, upper and lower portions of the side walls could be made of different materials, although this would unnecessarily complicate the apparatus.

It is, therefore, clear that it is not the particular temperature control means for achieving the change in temperature profile of the side walls, but the resulting non-linear profile itself which is important to the present invention.

Figure 6:
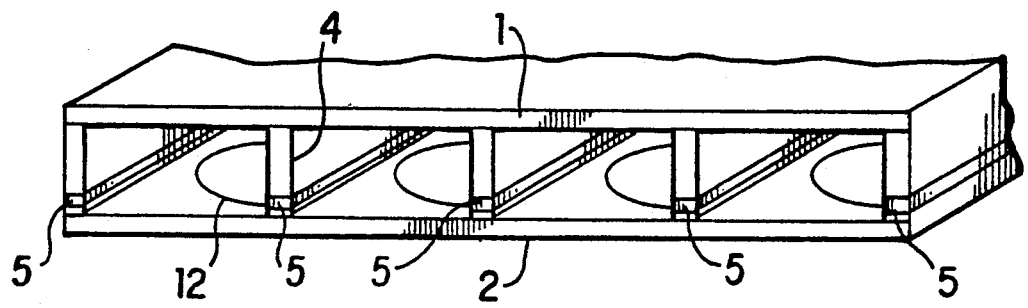
FIG. 6 is a perspective, partially cut away, view of a further embodiment of the invention where multiple enclosures are disposed side-by-side.

Further, the non-linear temperature profile of the side walls will be influenced by the particular structures involved. As shown in FIG. 6, for example, a plurality of the enclosures may be disposed side-by-side and share common side walls. This type of structure is useful and effective for mass production, but, quite obviously, the shared side walls will effect the temperature profile of those shared side walls. In such arrangements, of course, the effect of the shared side walls must be taken into account when determining the appropriate side wall temperature distribution, i.e. profile, for the above purposes.

Figure 7:
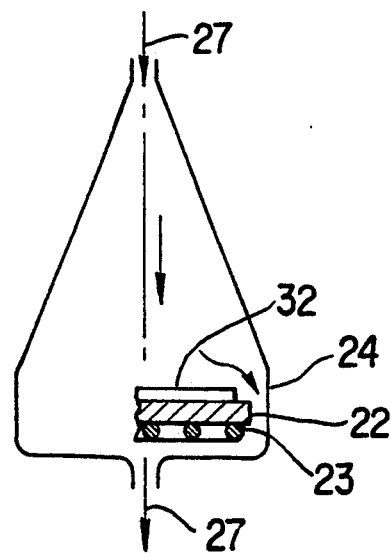
FIG. 7 is a diagrammatical illustration of a "vertical" type apparatus.

Also, the particular arrangement of the enclosure may effect such temperature distributions as explained above. For example, FIG. 7 shows a vertical thermal chemical vapor deposition apparatus. In this arrangement, a circular susceptor 22 is placed near the bottom of the vertical enclosure. Similar to FIGS. 1 and 2, heaters 23 are disposed below the circular susceptor 22 and these heaters may be fixed ring heaters separated in the radial direction.

In this arrangement, the gas flow moves along the direction of arrows 27, through the clearance between the susceptor 22 and the side walls of the enclosure 24, and across wafer 32 on susceptor 22.

As can be appreciated from FIG. 7, the gas flow will tend to stagnate at the center of susceptor or can flow in a helical direction, at least if the susceptor is rotated. Thus, the film growth tends to vary between the center and the circumferential portions of the susceptor, which is the same problem described above in connection with the "horizontal" type reactor. The problem is solved in the same manner, as described above in connection with the "horizontal" type reactor, in that a more uniform growth of the film is obtained by adjusting, for example, the electric power supplied to each of the ring heaters so as to raise the relative temperature of the part of the susceptor where the film growth is less than in other parts. A ring heater can be composed of several independent separate parts in order to give a possibility of slightly controlling the temperature gradient transverse to the flow, if necessary for this final purpose. In the case of a vertical enclosure, however, control of the side wall temperature distribution is not normally necessary in order to achieve an acceptable uniformity of the deposited film.

Accordingly, it can be seen from the above that the present invention is capable of compensating for all non-uniform film growths that occur due to spatial variations in gas temperature, vapor concentrations, etc., by the means of a longitudinal temperature gradient imposed on the susceptor (or wafer thereon) and/or a transverse temperature gradient and/or the non-linear temperature profile in the side walls. In general, the gradients are such that the temperature is higher in those areas where the vapor concentration is less or the deposition rate is less, so that a more uniform film is deposited or mass transfer is achieved. Particularly, in the case of a "horizontal" type apparatus, the invention avoids stable thermal convection gas rolls, which is a significant factor in preventing a uniform film growth in those apparatuses. This is achieved by the relatively inexpensive means of controlling the side wall temperature profile, and especially by the very expedient means of the side wall structure in connection with the spacers, and without necessarily utilizing any special heating device for the side walls.

On the other hand, when the longitudinal temperature gradient and/or the side walls temperature profile are not sufficient to acceptably control stable gas rolls (which may occur in some specific apparatus configurations, specific vapor deposition systems and specific operating parameters), the widthwise uniformity of film growth may be achieved by the above-described more complex transverse temperature gradient imposed on the susceptor (or wafer), i.e. a temperature gradient in the widthwise (transverse) direction. Further, usually the magnitude of this gradient decreases from the side walls to the middle of the susceptor, but the sign of the gradient depends on the direction of the Bénard rolls, as explained above, and may be positive or negative toward the side walls.

As a result, the film growth on the susceptor or wafer, or mass transfer, becomes uniform over the whole area of the susceptor or wafer, and a very highly accurate film can be produced or mass accurately evaporated. With this, precision products at high production rates can be achieved. This is true even without the prior art complicating techniques of pressure reduction within the reactor or the rotation of the susceptor. With this approach, the cost of such chemical vapor deposition apparatus is considerably reduced, and the operation thereof is considerably simplified.

It will also be apparent that the invention is not limited to vapor deposition on, for example, a wafer but can also be used for the uniform evaporation of a film already on a wafer, such as would be used in a conventional etching process, by choosing the chemical reaction between the reactants and the film. Other conventional uses of chemical vapor deposition apparatuses can also be employed using the present invention. Indeed, the invention is applicable to any thermal chemical vapor deposition type apparatus where the enclosure of that apparatus requires a gas flow, e.g. with chemical compounds as a raw material, next to a very hot susceptor inside the enclosure so that desired chemical reactions take place on a material, such as a wafer, placed on the very hot susceptor.

Turning now to details of the apparatus, the enclosure shown, for example, in FIGS. 1 and 2 may be made of any of the conventional materials normally used in construction of chemical vapor deposition apparatus. Of course, as is conventional in the art, these materials should be substantially inert, such as inert metals, e.g. stainless steel, or the like, but more usually the enclosures will be made of an inert ceramic material or silica glass, as is common in the art. While the cooling surface 1 (see FIG. 1) enclosing the cooling path 1' (see FIG. 2) may be made of the same material, it can be made of a different material, and the particular material of the cooling surface is not critical, so long as the under portion thereof is inert, for the reasons apparent from viewing FIG. 2.

Of course, as is sometimes conventional in the art, the side walls and bottom wall should be in good thermal contact and, when made of a cast ceramic material, may be made monolithic.

The spacer 5 may be made of any substantially inert material with a lower heat conductivity than the material of the side walls, as explained above. For example, if the side wall (indeed, the entire enclosure) is made of a ceramic material, the spacer may be that same ceramic material but in a foamed condition such that the heat transfer of the foamed ceramic is less than the heat transfer of the ceramic of the side walls, for the reasons explained above. Alternatively, the spacer may be a ceramic with less heat conductivity than the ceramic of the side walls. Alternatively, the spacer may be other inorganic materials, such as those made from an asbestos composition, or sintered ceramic particles, or even sintered low conductivity metal particles.

The thickness of the spacer will, of course, depend upon the particular system involved, as well as the materials of the spacer in the side walls, as well as the position of the spacer, vertically, in the side walls. However, generally speaking, the thickness of the spacer will be at least about 0.01 times the length of a side wall, more preferably at least about 0.1 times that length, and more preferably up to about 0.2 times that length, but may be up to about 0.4 times that length.

Of course, where other than an spacer is used to achieve the present non-linear temperature profile, e.g. a discontinuity in the side walls, such as holes, notches and the like, as described above, the heat conductivity ratio of such holes, notches and the like to the heat conductivity of the side walls should be similar to the ratio achieved by use of a spacer, so as to achieve the heat conductivity required for avoiding the gas flow rolls.

It will also be apparent that, instead of using electric heaters, e.g. as heaters 3, heat sources other than electricity may be used, e.g. fuel-fired heaters, radiant heaters, high frequency magnetic heaters, microwave heaters, and the like. Also, the number and spacing of the heaters will, quite obviously, depend upon the particular system involved, but, generally speaking, there should be at least three, and more usually four, five or six, spaced heaters to achieve the degree of temperature gradient required for the usual systems. Instead of heat sources, a local (partial) cooling system, such as heat exchange pipes, can be used for the same purpose, or the susceptor itself may have a non-homogeneous composition which produces a change of heat resistance in a necessary direction to achieve the same effect. There is considerable latitude in this regard, but whatever particular means are chosen, they should be such that the temperature gradient means, whatever those means, causes the temperature gradient to be at least in the direction of the gas flow, and such that at least the top surface of the susceptor or wafer is higher near the outlet of the enclosure than near the inlet of the enclosure.

Of course, as discussed above, the particular means of causing the required non-linear temperature profile in the side walls can be of a variety of particular means, but the particular means should be capable of causing an unsteady state of the gas flow, in order to avoid the gas rolls of the prior art, as explained above.

In a preferred embodiment the temperature gradient in the direction of the gas flow is achieved by a series of heaters disposed near the susceptor, and, more preferably, these heaters are electric heaters or magnetic heaters, and more particularly heaters which are separate heaters and have a variable power supply for each heater.

It will also be apparent from the above that other means can be employed to augment the reduction in gas rolls, and such other means may be employed if desired. For example, gas flow control means may be provided for controlling the gas flow through the enclosure such that the gas flow is at least in part in an unsteady state flow condition.

Thus, it will be appreciated that the invention is not restricted to the specific embodiments described above, and it will be obvious to those skilled in the art that numerous modifications can be provided which are within the spirit and scope of the above specification and annexed claims.

What is claimed is:

1. In a thermal vapor deposition apparatus comprising an enclosure having a gas inlet, a gas outlet, side walls, a susceptor, gas flow means for causing a flow of gas from said inlet to said outlet, and heating means for heating the susceptor, the improvement comprising temperature control means in the form of a discontinuity or spacer for controlling the temperature profile of the side walls wherein the temperature control means is in the side walls and has a heat conductivity lower than the heat conductivity of the side walls.

2. The apparatus of claim 1 wherein a temperature gradient is produced at least in the direction of the gas flow.

3. The apparatus of claim 2 wherein the temperature of the susceptor is higher near said outlet than near said inlet.

4. The apparatus of claim 1 wherein a temperature gradient is produced also in a direction transverse to the gas flow.

5. The apparatus of claim 4 wherein the temperature of the susceptor is lower or higher near the side walls than toward the middle thereof.

6. The apparatus of claim 1 wherein a temperature gradient means is a series of heaters disposed near the susceptor.

7. The apparatus of claim 6 wherein the heaters are electric heaters or magnetic heaters.

8. The apparatus of claim 7 wherein the heaters are separate heaters and a variable power supply is provided for each heater.

9. The apparatus of claim 2 wherein the temperature gradient is such that a mass flux at the susceptor is substantially uniform at least in the gas flow direction.

10. The apparatus of claim 1 wherein the temperature control means causes a non-linear temperature profile in the side walls.

11. The apparatus of claim 10 wherein the non-linear temperature profile is sufficient to cause unsteady state gas flow.

12. The apparatus of claim 11 wherein the gas flow is quasi-periodic or chaotic.

13. The apparatus of claim 1 wherein the spacer has a thickness of about 0.01 times to about 0.4 times the length of a side wall.

* * * * *